(12) United States Patent
Thomas et al.

(10) Patent No.: US 8,319,105 B2
(45) Date of Patent: Nov. 27, 2012

(54) WIRE-IN-CHANNEL SUPERCONDUCTOR

(75) Inventors: Adrian Mark Thomas, Bicester Oxfordshire (GB); Seungok Hong, New Providence, NJ (US)

(73) Assignees: Siemens Plc, Frimley, Camberley, Surrey (GB); Oxford Superconducting Technology, Carteret, NJ (US)

( * ) Notice: Subject to any disclaimer, the term of this patent is extended or adjusted under 35 U.S.C. 154(b) by 609 days.

(21) Appl. No.: 12/295,826

(22) PCT Filed: Jul. 11, 2007

(86) PCT No.: PCT/GB2007/050395
§ 371 (c)(1),
(2), (4) Date: Feb. 2, 2009

(87) PCT Pub. No.: WO2008/007141
PCT Pub. Date: Jan. 17, 2008

(65) Prior Publication Data
US 2009/0194316 A1   Aug. 6, 2009

Related U.S. Application Data

(60) Provisional application No. 60/830,694, filed on Jul. 14, 2006.

(30) Foreign Application Priority Data

Nov. 15, 2006   (GB) .................................. 0622755.7

(51) Int. Cl.
*H01B 12/00*   (2006.01)
*H01L 39/24*   (2006.01)

(52) U.S. Cl. ..................................... 174/125.1; 505/232

(58) Field of Classification Search ................ 174/125.1
See application file for complete search history.

(56) References Cited

U.S. PATENT DOCUMENTS

| | | | | |
|---|---|---|---|---|
| 1,384,448 A * | 7/1921 | Gilbert et al. | ................... | 72/278 |
| 3,501,581 A * | 3/1970 | Edwards | ...................... | 174/15.5 |
| 3,551,976 A * | 1/1971 | Zentgraf et al. | .............. | 9/90.01 |
| 3,570,118 A * | 3/1971 | Reynolds et al. | ................. | 9/599 |
| 3,699,647 A * | 10/1972 | Bidault et al. | .................. | 29/599 |
| 4,079,187 A * | 3/1978 | Fillunger et al. | ............. | 174/15.5 |
| 4,490,578 A * | 12/1984 | Suzuki et al. | ................ | 174/15.5 |
| 4,751,614 A * | 6/1988 | Mehnert | ...................... | 361/437 |

(Continued)

FOREIGN PATENT DOCUMENTS

EP   0 500 101 A1   8/1992

(Continued)

OTHER PUBLICATIONS

Katsunori Wada et al., "High-Strength and High-RRR Al-Ni Alloy for Aluminum-Stabilized Superconductor", XP-002169351, IEEE Transactions on Applied Superconductivity, vol. 10, No. 1 Mar. 2000, pp. 1012-1015.
International Search Report dated Nov. 6, 2007 (three (3) pages).
Great Britain Search Report dated Feb. 16, 2007 (one (1) page).
PCT/ISA/237 (six (6) pages).

*Primary Examiner* — Timothy Thompson
*Assistant Examiner* — Nathan Milakovich
(74) *Attorney, Agent, or Firm* — Crowell & Moring LLP

(57) ABSTRACT

In a method of manufacturing a copper clad aluminum channel superconductive conductor, an electrically conductive wire comprising a metal or alloy core is formed with a longitudinally extending groove in a surface thereof. A wire made of a material that exhibits superconducting properties within a defined temperature range is soldered into the groove.

13 Claims, 5 Drawing Sheets

U.S. PATENT DOCUMENTS

| | | | | |
|---|---|---|---|---|
| 4,857,675 A | * | 8/1989 | Marancik et al. | 174/15.4 |
| 4,954,479 A | * | 9/1990 | Dubots et al. | 505/230 |
| 4,994,633 A | * | 2/1991 | Puhn | 174/125.1 |
| 5,266,416 A | * | 11/1993 | Inoue et al. | 428/651 |
| 5,620,798 A | * | 4/1997 | Huang et al. | 428/379 |
| 6,508,001 B2 | * | 1/2003 | Adrian | 29/896.43 |

FOREIGN PATENT DOCUMENTS

| | | | |
|---|---|---|---|
| JP | 59224007 A | * | 12/1984 |
| JP | 4-71112 A | | 3/1992 |
| WO | WO 2006/035065 A2 | | 4/2006 |

* cited by examiner

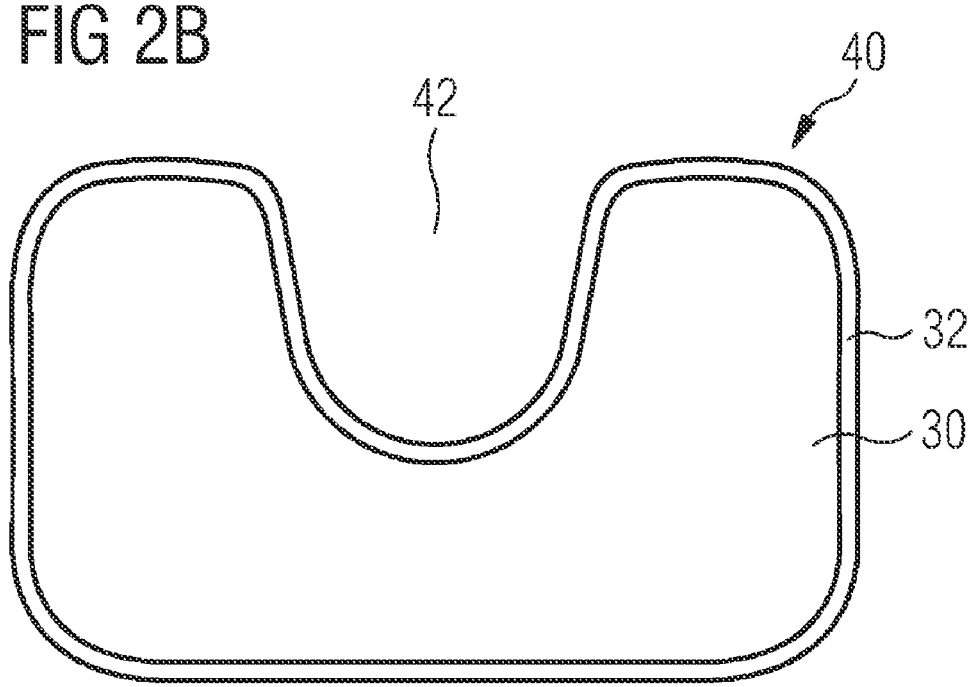
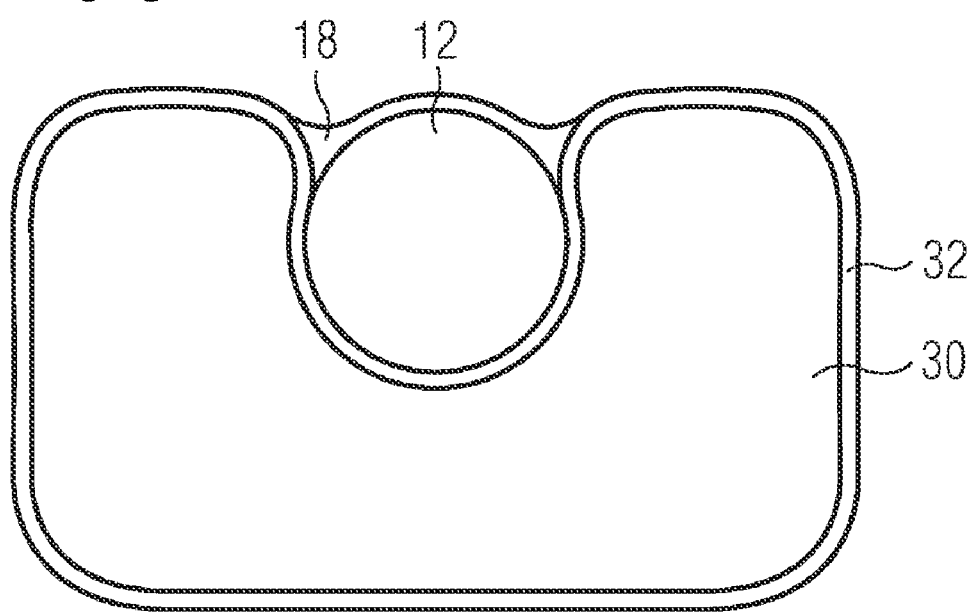

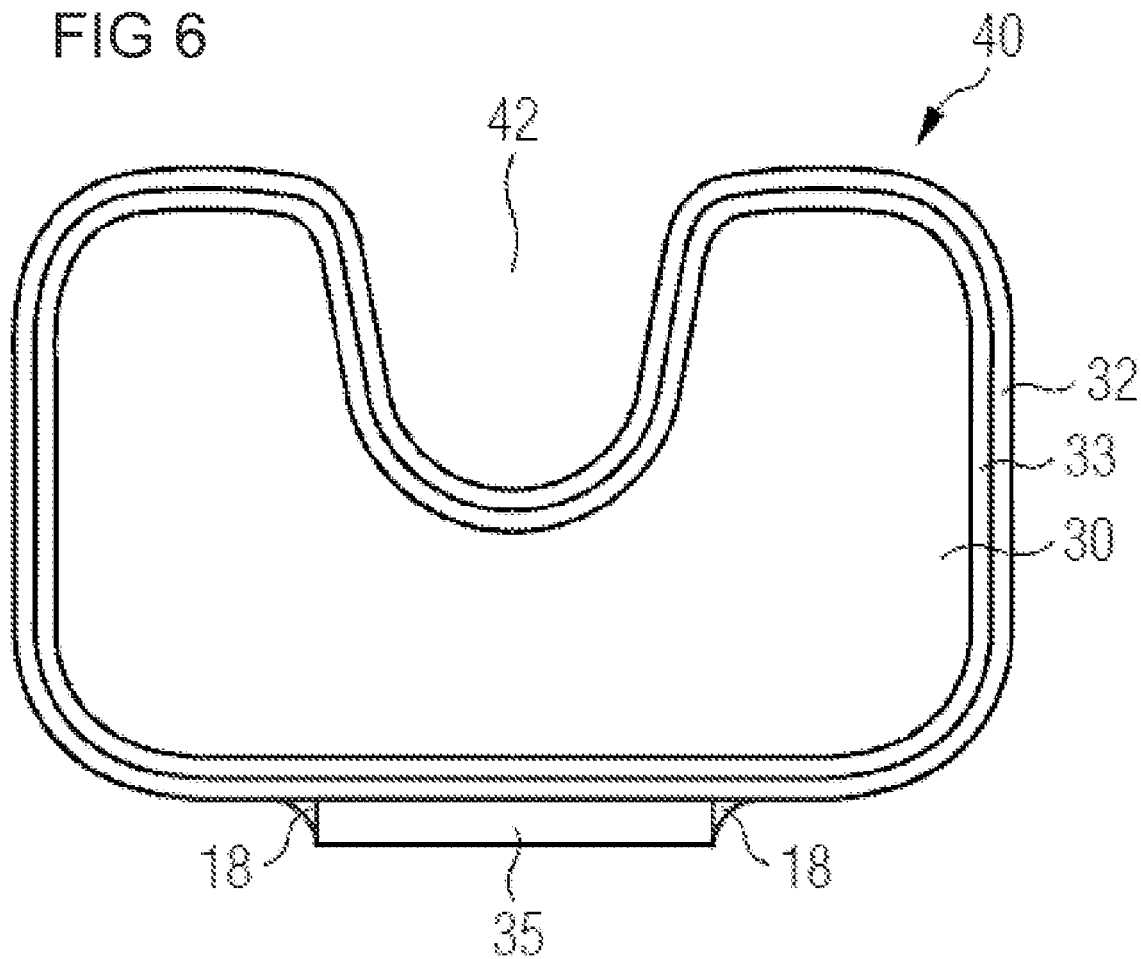

WIRE-IN-CHANNEL SUPERCONDUCTOR

This is a U.S. National Stage Application under 35 U.SC. §371 pursuant to International Application No. PCT/GB2007/050395, filed Jul. 11, 2007, and claims priority of U.S. Provisional Application No. 60/830,694, filed Jul. 14, 2006, and British Application No. GB 0622755.7, filed Nov. 15, 2006, the entire disclosure of which is herein expressly incorporated by reference.

The present invention is directed to a wire-in-channel type superconductive conductor of the type which is used in superconducting magnets, such as are commonly found in magnetic resonance imaging machines, particle accelerators, etc., and methods of producing such wire-in-channel type superconductive conductors.

BACKGROUND OF THE INVENTION

In wire-in-channel superconductive conductors, a superconducting wire is soldered into a normally-conductive channel of a corresponding dimension. FIG. 1 is an illustration of a conventional wire-in-channel superconductor 10. Superconducting wire 12 typically consists of a number of filaments 14 of a superconducting material, such as NbTi, in a normally-conductive matrix material 16, such as copper. Such a superconductive wire 12 is soldered 18 into a corresponding groove in conductive channel 20. The channel 20 is typically of copper, and typically has an approximately rectangular cross-section. The external surface of the channel 20 may be tinned, for example with a suitable solder.

Such wire-in-channel superconductive conductors have been found effective in achieving long continuous lengths, and in providing a superconductive conductor which is suitable for persistent magnets. Wire-in-channel superconductive conductors of this type are typically insulated by a polyester braid 24.

The known copper channel wire-in-channel type superconductive conductor 10 is designed to provide a high copper-to-superconductor ratio, for stability, without the necessity of processing all of the copper with the superconductor. As a result, the cost of production is significantly reduced as compared to methods of production which require processing all of the copper with the superconductor.

Because of the large quantity of material used in the conductive channel in many applications, it is desirable to reduce the weight of the channel 20 and also to make it more pliable for ease in magnet fabrication. Aluminum is an excellent substitute material for the usual copper, being less costly, more pliable and lighter in weight; however, the use of aluminum as a direct substitute for copper presents several manufacturing difficulties such as quality of solder bond, soldering temperature and compatibility of fluxes as well as the flexibility of the completed wire-in-channel conductor. Accordingly, aluminum has not been used as a direct substitute for the copper material normally used for the channel 20 shown in FIG. 1.

Japanese patent application JP04071112A describes an arrangement in which an aluminum channel 20 is formed, and at least the interior of the groove 22 is coated in copper by a process such as electroplating, dipping or vapour deposition. The superconducting wire is then soldered 18 onto the copper coating within the groove 22, the resulting composite material then being subjected to a drawing process.

SUMMARY OF THE INVENTION

The present invention provides alternative and improved methods for producing a copper-clad aluminum conductive channel and a superconducting wire in copper-clad aluminum channel conductor using this channel.

The present invention also provides a wire-in-channel superconductive conductor wherein the conductive channel is fabricated from an electrically conductive metal or alloy core with at least one layer of a metallic cladding comprising a layer of a high strength alloy; and an outer layer of copper.

The above, and further, objects, characteristics and advantages of the present invention will become more apparent from consideration of the following description of certain embodiments thereof, in conjunction with the accompanying drawings, wherein:

BRIEF DESCRIPTION OF THE DRAWINGS

FIG. 2B shows a cross-section of a copper-clad aluminum channel conductor, formed from the copper-clad aluminum wire of FIG. 2A, according to an aspect of the present invention;

FIG. 3 shows a cross-section of a wire-in-channel superconductive conductor of the present invention;

FIG. 6 shows another embodiment of the invention that includes an elongated member included with the channel conductor.

DETAILED DESCRIPTION OF THE DRAWINGS

Figure 1:
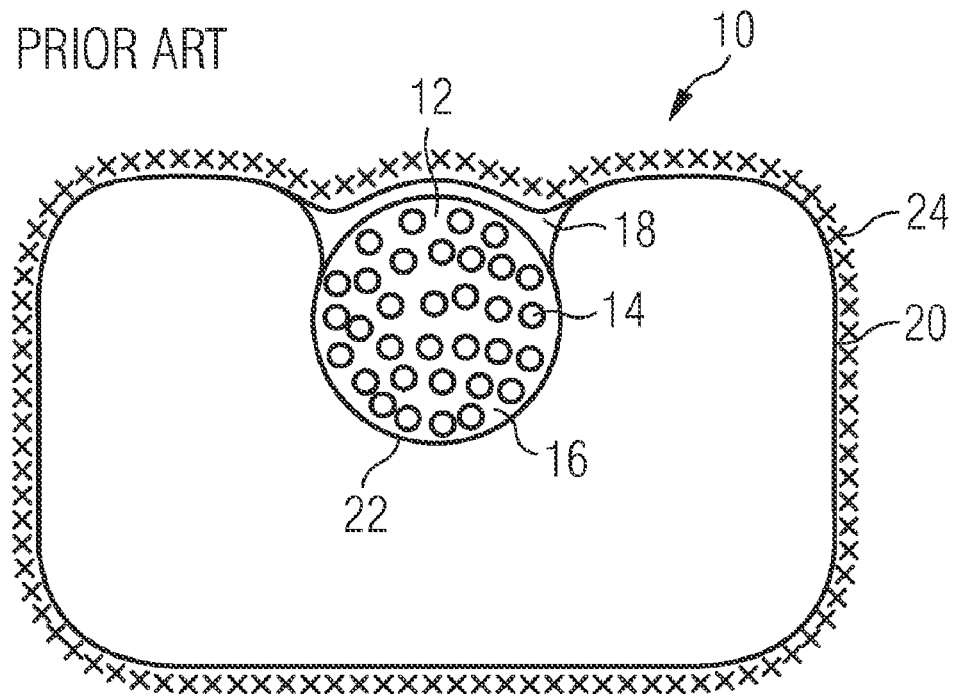
FIG. 1 shows a cross-section of a wire-in-channel superconductive conductor of the prior art.
Figure 2A:
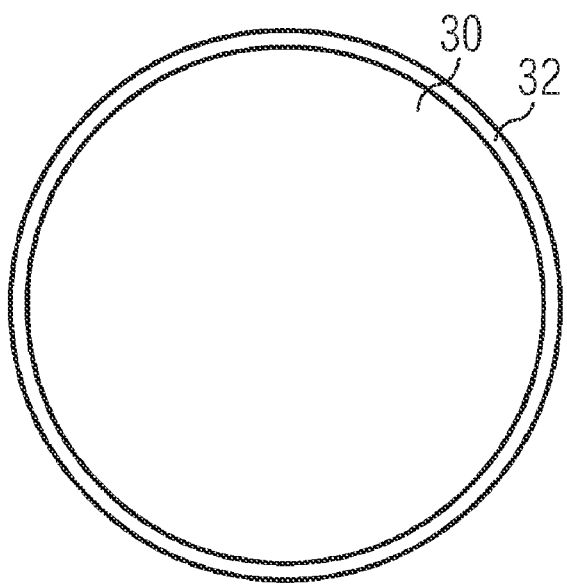
FIG. 2A shows a cross-section of a copper-clad aluminum wire useful in methods according to the present invention.

According to the present invention, a copper-clad aluminum conductive channel for use in producing a superconducting wire in copper-clad-aluminum channel, is produced from an aluminum wire 30 coated with a metallurgically bonded copper layer 32 such as shown in FIG. 2A.

Rather than forming an aluminum channel section which is then at least partially coated with copper by a process such as electroplating, dipping or vapour deposition, the present invention provides a cost-effective and efficient method for producing copper-clad aluminum channel section suitable for use in producing composite wire-in-channel superconductive conductor, using commercially-available copper clad aluminum wire, such as illustrated in cross-section in FIG. 2A. Copper clad aluminum wire is commercially available having 10% or 15% copper by cross-sectional area, with a circular cross-section.

The cost of commercially available electrical grade copper clad aluminum wire is lower in price per unit length than solid copper. It is also lighter in weight because of the lighter weight of aluminum. A 10% copper clad aluminum wire is 2.8 times as long as a similar wire consisting of an equal weight of copper.

By employing such a composite wire in place of solid copper, such as is used for the channel 20 in conventional wire-in-channel superconductor, manufacturing costs are reduced, the weight of the final conductor is reduced and no change is required in the production process.

By employing such a composite wire, a much simpler manufacturing method may be employed as compared to depositing a copper coating onto at least part of the surface of an aluminum channel, as described by the prior art.

By applying conventional wire drawing and shaping techniques to the copper-clad aluminum wire represented in FIG. 2A, a copper clad aluminum channel 40 may be formed, as illustrated in cross-section in FIG. 2B.

In an example of a manufacturing process according to an aspect of the present invention, a circular cross-section copper clad aluminum wire, commercially available and fabricated by known industrial manufacturing process, is processed using wire drawing and shaping techniques, conventional in themselves, into a grooved channel, approximately rectangular in profile (FIG. 2B). For illustration, the rectangle will be assumed to be 1.27 mm by 3.175 mm in cross section and containing a 0.813 mm wide groove 42. The channel need not be rectangular, or approximately rectangular, but should include groove 42.

The copper clad aluminum wire described is much softer than solid copper wire, which extrapolates to a higher production speed in forming the channel and far less die wear, both of which lower the cost of forming the channel 40 as compared to a corresponding method employing solid copper wire to form the channel 20.

The grooved channel 40 and a 0.813 mm diameter superconductive wire 12 are then passed together through a solder bath where the superconductive wire 12 is pressed into the groove 42 in the copper clad aluminum channel 40. The composite superconductive conductor thus formed may then be passed through a die within the solder bath to press the superconductive wire 12 into the groove 42. The die may also serve to draw the conductor to a final cross-section, and in doing so may deform the channel 40 to more securely retain the superconductive wire 12, as illustrated in FIG. 3.

The specific heat capacity of the copper clad channel is less than that of the conventional solid copper channel, which results in higher speeds in the soldering process. A controlling parameter in setting the production line speed is the rate that the channel can be heated to the soldering temperature, and since it takes less energy to heat the copper clad aluminum channel to the soldering temperature, as compared to a conventional copper channel, the production line speed can be proportionally increased, as compared to a similar method employing a solid copper channel.

The resulting structure may be quenched at the exit from the solder bath, or allowed to cool naturally, to solidify the solder and bond the structure together. FIG. 3 is a cross section of a finished copper clad aluminum channel with a superconductor wire 12 soldered 18 in place, manufactured according to a method of the present invention. The conductor is then spooled ready for any subsequent processing desired.

The method of forming a composite superconducting conductor having a superconducting wire 12 soldered 18 into a groove 42 in a copper 32 clad aluminum 30 channel according to the invention does not require steps such as electroplating, dipping or vapour deposition, as required by the prior art, resulting in a simplified and less costly manufacturing method, in turn resulting in greater reliability and reduced cost of the finished product.

While copper clad aluminum wire is available commercially, and the formation of the copper-clad aluminum wire does not form part of the present invention, it may be noted that several methods for forming the composite copper clad aluminum wire are available. Some of these are listed below and the choice again depends on the application. If required, copper-clad aluminum wire may be produced in-situ for use according to the present invention by any of the following processes.

Hot bonding process—Bonds a relative thick copper layer on the aluminum core.

Electroplating—Electroplating of copper on aluminum is usually restricted to thin layers of copper up to several micrometers.

Co-Extrusion

Co-Drawing

The method employed according to the present invention for converting a copper-clad aluminum wire into a copper-clad channel 40 profile is simpler and more industrially acceptable than the copper coating of an aluminum channel suggested by the prior art.

Figure 4A:
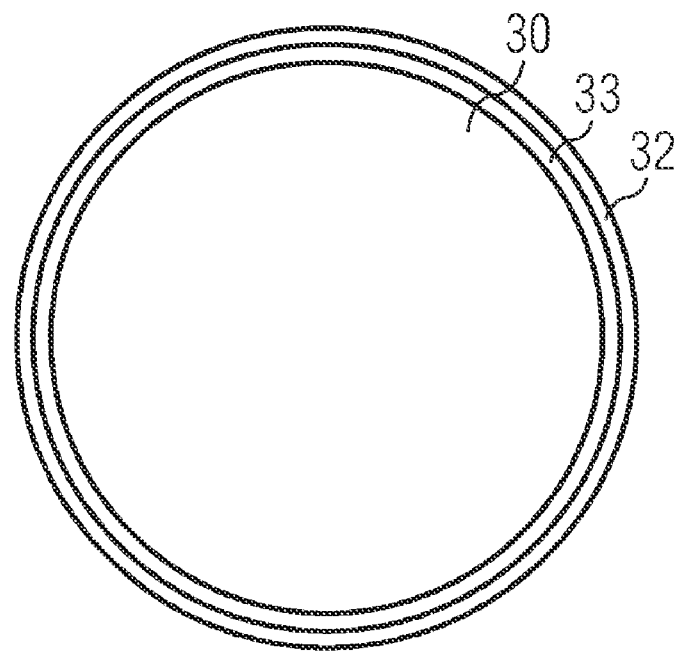
FIG. 4A is a cross section of an aluminium wire clad with a layer of a high strength alloy.
Figure 4B:
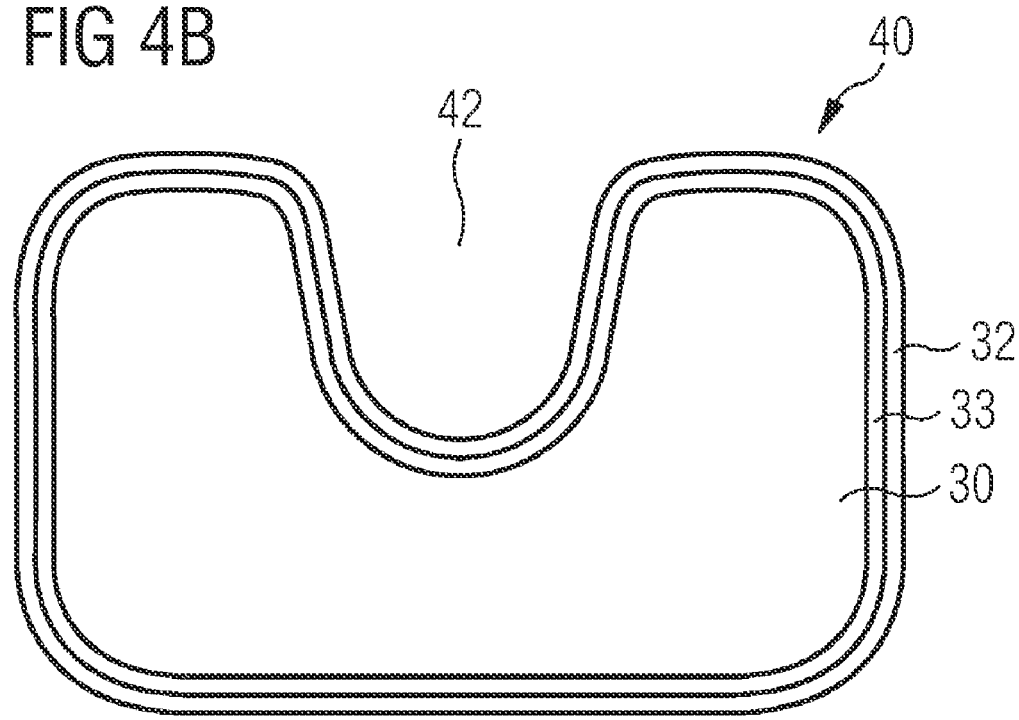
FIG. 4B is a cross section of the cladded wire of FIG. 4A which has been formed into a channel conductor.

The aluminum 30 used to form the channel can be replaced by any suitable aluminum alloy, or indeed any other suitable alloy. The choice will depend on the application. In one case, electrical conductivity may dictate the choice, while in other cases the mechanical strength may be the dominant criterion. Although commercially available copper clad aluminum wire has been described, the invention is not limited to this single configuration. By incorporating a multiple layer structure, a reinforced channel conductor can be obtained. For example, a wire 30 comprising aluminum or other electrically conductive alloy core encased within a layer of high strength alloy 33 such as steel, with an outer layer 32 of copper, may be used, as shown in FIGS. 4A and 4B. Such wire may be commercially produced with, a convenient cross-section, typically circular, and formed into the required channel profile by the methods described above. The presence of the high strength alloy will add to the mechanical strength of the final wire-in-channel conductor, without significantly detriment to its electrical or thermal properties, and without introducing further steps into the manufacturing method for the wire-in-channel conductor. Final assembly of this alternate embodiment would be done on the same production line now used for the conventional copper channel.

Figure 5:
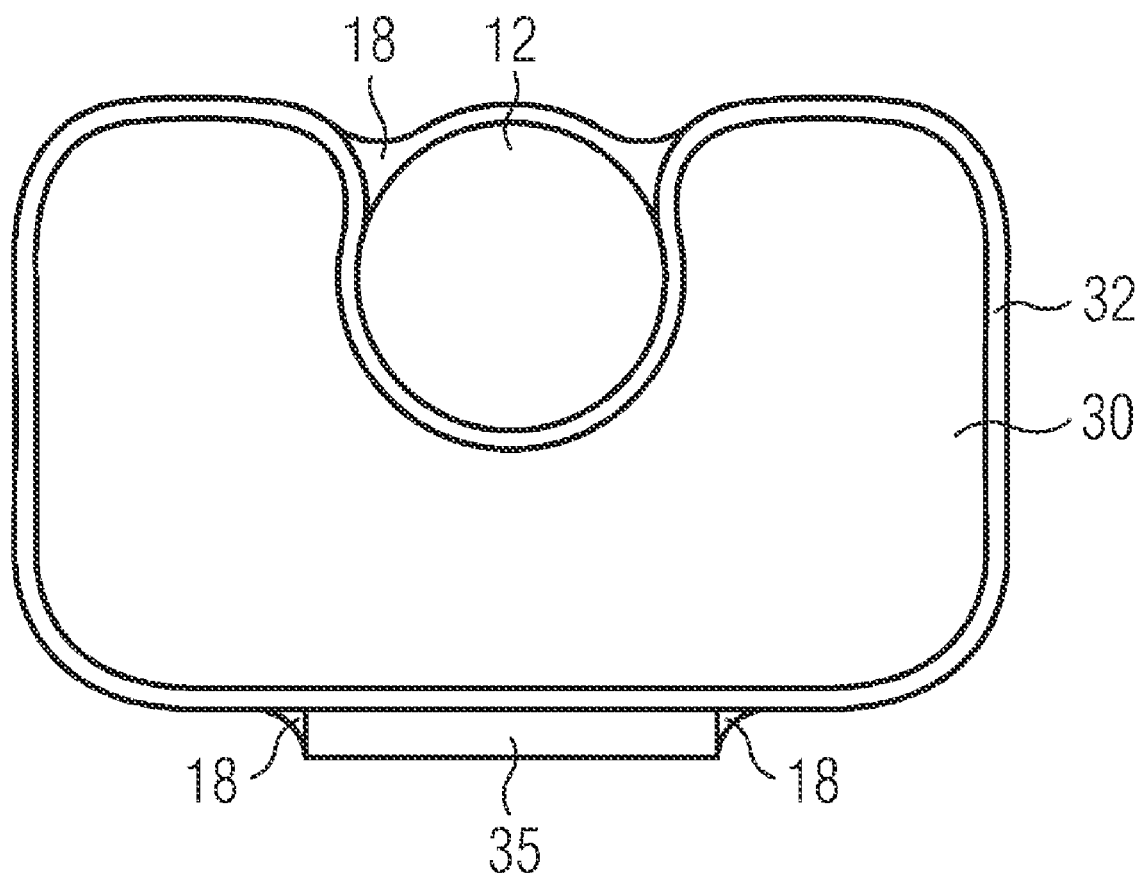
FIG. 5 shows one embodiment of the invention that includes an elongated member included with the channel conductor.

Alternatively, or in addition, to the use of a layer of high-strength alloy within the wire used to form the channel, an elongate high-strength member such as a wire or strip 35 (the alternative arrangement is shown schematically in FIG. 5 and the additional arrangement is shown schematically in FIG. 6) may be included with the superconductive wire 12 and the channel 40 when forming the composite wire-in-channel conductor, to mechanically strengthen the composite conductor. The high-strength member can be incorporated in a linear or spiral fashion prior to, during or after the solder operation.

The step of soldering the superconducting wire into the copper clad aluminum profile to form the composite conductor may be performed using any suitable soft solder including but not limited to alloys of Pb, Cu, Sb, Sn and Zn. One particular solder which may be used comprises Sn-5% Sb by weight.

The aluminum used in the copper clad aluminum wire should preferably be high purity aluminum, electrical grade aluminum or high strength aluminum.

The copper used in the copper clad aluminum wire should preferably be high conductivity copper such as 1100 (OFHC) grade copper.

The copper used in the copper clad aluminum wire may be an alloyed copper for improved strength.

It may be found advantageous to apply a tinning layer over at least part of the outer copper layer 32 of the channel, particularly the surface in and near the groove 42 which will receive and be soldered to the superconducting wire. Such tinning layers are known to assist soldering. A tinning layer may be of tin, or any suitable solder. Once the channel 40 and the superconductive wire 12 have been soldered 18 together, the whole outer surface of the resultant wire-in-channel superconductor will most likely be tinned.

In further embodiments of the present invention, an elongate member of a material of high specific heat capacity can be incorporated into the composite conductor before, during or after the solder bonding of the superconducting wire to the channel profile, to improve thermal stability. Such material can be treated to accept solder by extrusion, electroplating or co-drawing, etc.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A method of manufacturing a copper clad aluminum channel superconductive conductor, said method comprising:
fabricating, from an electrically conductive wire having a substantially circular cross-section, a metallic channel in the form of a longitudinally extending groove in a surface of the electrically conductive wire using wire drawing or shaping techniques, wherein the electrically conductive wire includes an outer layer of copper with a substantially circular cross-section that encases a layer of high strength alloy with a substantially circular cross-section, which in turn encases an aluminum wire with a substantially circular cross-section; and
soldering into said groove a wire which comprises a material that exhibits superconducting properties within a defined temperature range.

2. The method according to claim 1, wherein a further elongate member is included with the wire in the channel when forming the copper clad aluminum channel superconductive conductor, to mechanically strengthen the channel conductor.

3. The method according to claim 2 wherein the further elongate member is incorporated in a linear or spiral fashion prior to, during or after the solder operation.

4. The method according to claim 1, wherein said wire comprises a number of filaments of a material that exhibits superconducting properties within a defined temperature range in a normally-conductive matrix material.

5. The method according to claim 4, wherein said matrix material comprises copper.

6. The method according to claim 1, further comprising the step of at least partially tinning the outer layer of copper of the metallic channel at least in and near the groove, prior to soldering the wire into the groove.

7. The method according to claim 1, wherein a further elongate member is incorporated into the channel conductor before, during or after the solder bonding of the wire to the channel, to improve thermal stability.

8. The method of claim 7 wherein the further elongate member is treated to accept solder.

9. A channel conductor comprising:
a metallic channel having a longitudinally extending groove in a surface thereof and
a wire soldered into said groove; wherein,
said wire comprises a material that exhibits superconducting properties within a defined temperature range; and
said metallic channel is fabricated from an electrically conductive wire having a substantially circular cross-section using wire drawing or shaping techniques, wherein the electrically conductive wire includes an outer layer of cooper with a substantially circular cross-section that encases a layer of high strength alloy with a substantially circular cross-section, which in turn encases an aluminum wire with a substantially circular cross-section.

10. The channel conductor according to claim 9, wherein said wire comprises a number of filaments of a material that exhibits superconducting properties within a defined temperature range in a normally-conductive matrix material.

11. The channel conductor according to claim 10, wherein said matrix material comprises copper.

12. The channel conductor according to claim 9, wherein the outer layer of copper of the metallic channel is at least partially tinned, at least in and near the groove.

13. A channel conductor according to claim 9, wherein a further elongate member is incorporated into the channel conductor, to improve thermal stability.

* * * * *